(12) United States Patent
Ahn

(10) Patent No.: US 9,082,472 B2
(45) Date of Patent: Jul. 14, 2015

(54) BACK-UP POWER MANAGEMENT FOR EFFICIENT BATTERY USAGE

(71) Applicant: TAEJIN INFO TECH CO., LTD., Seoul (KR)

(72) Inventor: Hyukjong Ahn, Seoul (KR)

(73) Assignee: TAEJIN INFO TECH CO., LTD., Seoul (KR)

( * ) Notice: Subject to any disclaimer, the term of this patent is extended or adjusted under 35 U.S.C. 154(b) by 259 days.

(21) Appl. No.: 13/678,227

(22) Filed: Nov. 15, 2012

(65) Prior Publication Data

US 2014/0133257 A1    May 15, 2014

(51) Int. Cl.
*G11C 5/14*    (2006.01)

(52) U.S. Cl.
CPC ...................................... *G11C 5/141* (2013.01)

(58) Field of Classification Search
USPC .......................................... 365/226, 228, 229
See application file for complete search history.

(56) References Cited

U.S. PATENT DOCUMENTS

| | | | |
|---|---|---|---|
| 8,635,494 B2* | 1/2014 | Cho | 714/22 |
| 8,688,926 B2* | 4/2014 | Breakstone et al. | 711/154 |
| 8,839,024 B2* | 9/2014 | Cho | 714/6.1 |
| 2009/0172469 A1* | 7/2009 | Xiao | 714/14 |
| 2010/0332897 A1* | 12/2010 | Wilson | 714/14 |
| 2012/0210163 A1* | 8/2012 | Cho | 714/6.21 |

* cited by examiner

*Primary Examiner* — Pho M Luu
(74) *Attorney, Agent, or Firm* — Saliwanchik, Lloyd & Eisenschenk

(57) ABSTRACT

Battery backup devices and methods of performing a backup operation using the same are provided. A battery backup device can include a partial battery power controller configured to shut off power to components to be backed up one by one as data backup is completed on each device. The battery backup devices and methods provided can efficiently utilize battery power such that power consumption and charging time can be reduced.

17 Claims, 2 Drawing Sheets

BACK-UP POWER MANAGEMENT FOR EFFICIENT BATTERY USAGE

BACKGROUND

Use of backup power supplies is very important with electronic equipment, especially systems which use memory devices. In particular, systems that include volatile memories or volatile memory devices should be connected to battery backup devices in the event that external power is lost.

When the power supply is interrupted, one or more batteries provide power. In the case of volatile memory devices, it is desired that the power supply provide power at least until the data of the volatile memory device is completely backed up. In an attempt to provide sufficient power to give enough time for backing up volatile memory devices, existing battery backup devices utilize high capacity batteries. Due to the high capacity of the batteries used, power consumption is high and the time required to charge is long. If the batteries are not fully charged when external power is lost, it can lead to complete loss of all power, including backup power, before data backup is complete.

BRIEF SUMMARY

Embodiments of the subject invention relate to efficient battery backup devices, methods of using the same, and methods of fabricating the same. A battery backup device of the subject invention can advantageously reduce power consumption and provide improved reliability.

Embodiments of the subject invention can provide methods of managing batteries of a battery backup device. A battery backup device of the subject invention can include one or more batteries or can be connected to a one or more external batteries and can be configured to shut off power from the one or more batteries to systems, devices, and/or components to be backed up one at a time as data backup is completed on a system, device or component. For example, a battery backup device can be configured to disconnect a battery or batteries from a system, device (e.g., a memory device), or component being backed up once data backup of the device is complete.

In an embodiment, a battery backup device can include at least one battery and a partial battery power controller configured to supply power from the at least one battery to a plurality of components of a system to be backed up. The partial battery power controller can also be configured such that, during a backup operation, once data backup of a particular component of the plurality of components is complete, the partial battery power controller shuts off power from the at least one battery to that particular component.

In another embodiment, a method of performing a backup operation on a system can include providing a battery backup device in operable communication with the system. The battery backup device can include at least one battery and a partial battery power controller configured to supply power from the at least one battery to a plurality of components of the system to be backed up. The partial battery power controller can also be configured such that, during a backup operation, once data backup of a particular component of the plurality of components is complete, the partial battery power controller shuts off power from the at least one battery to that particular component.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

DETAILED DISCLOSURE

Figure 1:
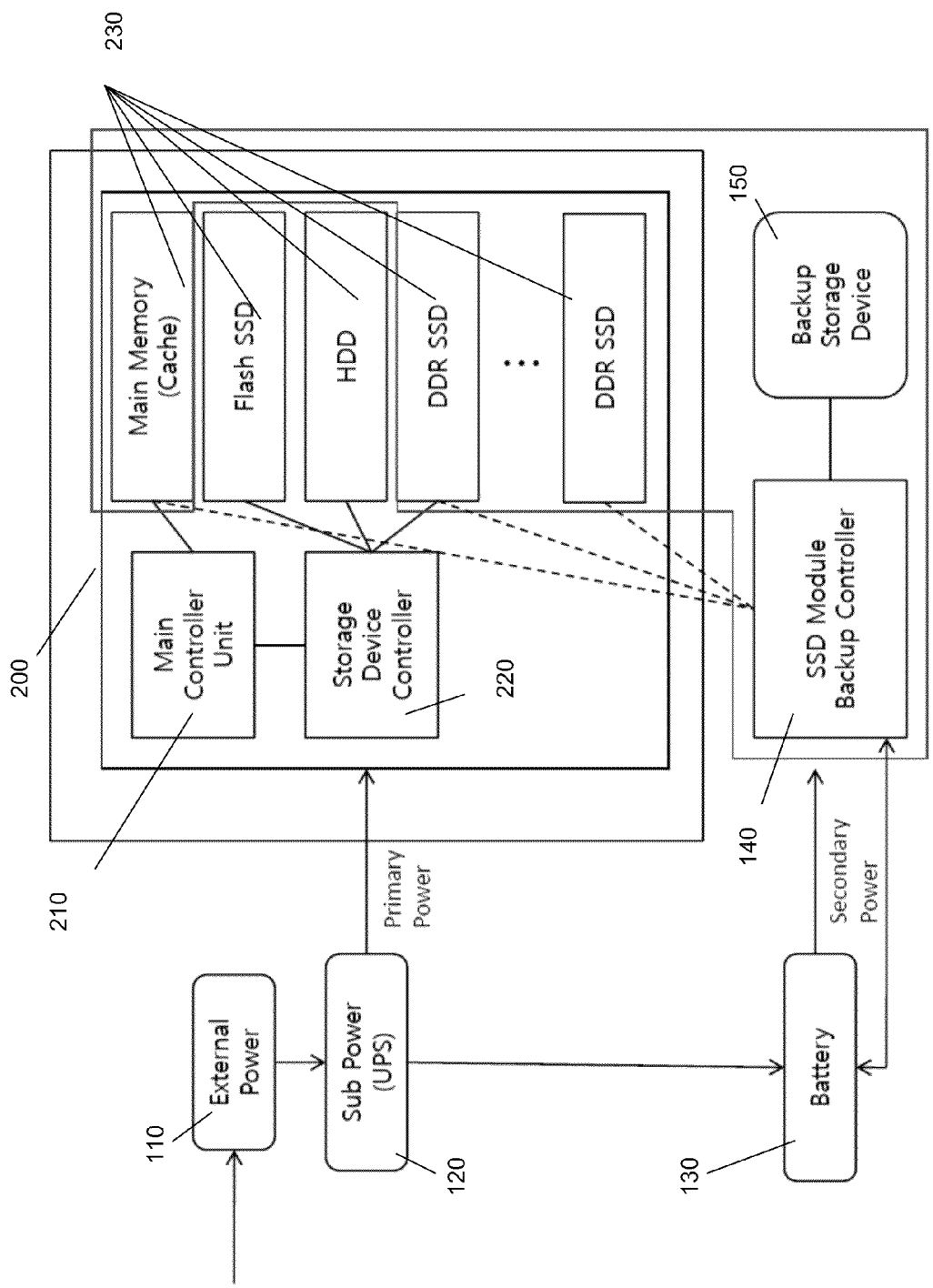
FIG. 1 shows a schematic of a battery backup device for backing up a system.

Embodiments of the subject invention relate to efficient battery backup devices, methods of using the same, and methods of fabricating the same. A battery backup device of the subject invention can advantageously reduce power consumption and provide improved reliability.

Embodiments of the subject invention can provide methods of managing batteries of a battery backup device. A battery backup device of the subject invention can include one or more batteries or can be connected to a one or more external batteries and can be configured to shut off power from the one or more batteries to systems, devices, and/or components to be backed up one at a time as data backup is completed on a system, device or component. For example, a battery backup device can be configured to disconnect a battery or batteries from a system, device (e.g., a memory device), or component being backed up once data backup of the device is complete.

Embodiments of the subject invention can provide prioritization of devices to be backed-up such that devices to be backed up are backed up one at a time. The order in which the devices are backed up can be predetermined or random. In an embodiment, a predetermined order can be based on prioritizing devices to be backed up. The prioritization can be based on the importance level of a particular device being backed up.

In an embodiment, the subject invention can provide prioritization of memories or memory devices (e.g., volatile memories or memory devices) to be backed up. The order in which the memory devices are backed up can be predetermined or random. In an embodiment, a predetermined order can be based on prioritizing memory devices to be backed up. The prioritization can be based on the importance level of a particular memory device being backed up.

In an embodiment, a battery backup device can include a partial battery power controller. The partial battery power controller can be in operable communication with one or more batteries. For example, the partial battery power controller can be physically connected, electrically connected, and/or directly electrically connected (i.e., electrically connected with no intervening components) to the one or more batteries. The one or more batteries in operable communication with the partial battery power controller can be part of the battery backup device, external to the battery backup device, or a combination thereof. The partial battery power controller can also be in operable communication with a semiconductor storage device (SSD) module backup controller and/or one or more backup storage devices. For example, the partial battery power controller can be physically connected, electrically connected, directly electrically connected, and/or in wireless communication with the backup storage device and/or the SSD module backup controller. The partial battery power controller can also be in operable communication (e.g., physically connected, electrically connected, directly electrically connected, and/or in wireless communication) with one or more systems, devices, and/or components connected to the battery backup device. For example, the partial battery power controller can be in operable communication with one or more devices (e.g., memory devices) connected to the partial battery power controller in order to be backed up from one or more batteries.

In an embodiment, a battery backup device can include a partial battery power controller to manage power of one or more batteries in order to perform a backup operation on one or more systems, devices, and/or components. The one or more batteries in operable communication with the partial battery power controller can be part of the battery backup device, external to the battery backup device, or a combination thereof. The battery backup device can be in operable communication with (e.g., physically connected, electrically connected, directly electrically connected, and/or in wireless communication) one or more systems, devices, and/or components to be backed up. The partial battery power controller can cut off power to each device and/or system individually. During a backup operation, after a certain device or system is backed up, the partial battery power controller can shut power off to that device or system, thereby efficiently managing battery power. That is, once data backup has been completed for a particular system, device, or component, the partial battery power controller can shut off power to that system, device, or component. Thus, a battery backup device of the subject invention can utilize batteries of lower capacity than are used in existing battery backup devices, thereby decreasing power consumption and charging time. This also increases the efficiency and reliability of the backup operation due to lower charging time.

In an embodiment, the partial battery power controller can provide power to one system, device, or component to be backed up at a time during a backup operation. Once data backup has been completed for that particular system, device, or component, the partial battery power controller can shut off power to that system, device, or component and provide power to another system, device, or component. This can continue until all systems, devices, and/or components connected to the partial battery power controller have completed data backup.

In an embodiment, the partial battery power controller can provide power from only one battery of a plurality of batteries at a time. Once power from that particular battery has been exhausted, the partial battery power controller can provide power from another battery of the plurality of batteries until that battery is exhausted, and so on.

FIG. 1 shows a schematic of a battery backup device for backing up a system 200 having a main controller unit 210, a storage device controller 220, and memory devices 230. A sub power device 120 (e.g., an uninterruptable power supply (UPS)) is connected to external power 110 and is in operable communication with the system 200 to provide primary power. The sub power device 120 can include or be in operable communication with a battery 130, which provides secondary power in the event that the primary power is lost. The battery 130 is in operable communication with an SSD module backup controller 140, and a backup storage device 150 is also present. If external power 110 is lost, the SSD module backup controller 140 backs up the main memory and double data rate (DDR) SSDs 230.

In the battery backup device of FIG. 1, there is no control of the batteries 130. Instead, the whole battery backup device is operated by sub power from the sub power device 120 (e.g., a UPS). When the external power 110 is interrupted, the sub power device 120 detects it and notifies the storage device controller 220 to control backup of the memory devices 230. If sub power is lost, the SSD module backup controller 140 is operated by the battery 130, and data of the volatile memory devices 230 starts being stored in the backup storage device 150.

Similar battery backup devices are disclosed in Korean Patent Application No. 10-2011-0040756, U.S. Patent Application Publication No. US-2011-0271143A1, and U.S. patent application Ser. No. 13/094,115, the contents of which are each incorporated herein by reference in their entireties. Similar backup devices are disclosed in Korean Patent Application No. 10-2012-0014162 and U.S. patent application Ser. No. 13/188,649, the contents of which are each incorporated herein by reference in their entireties.

Figure 2:
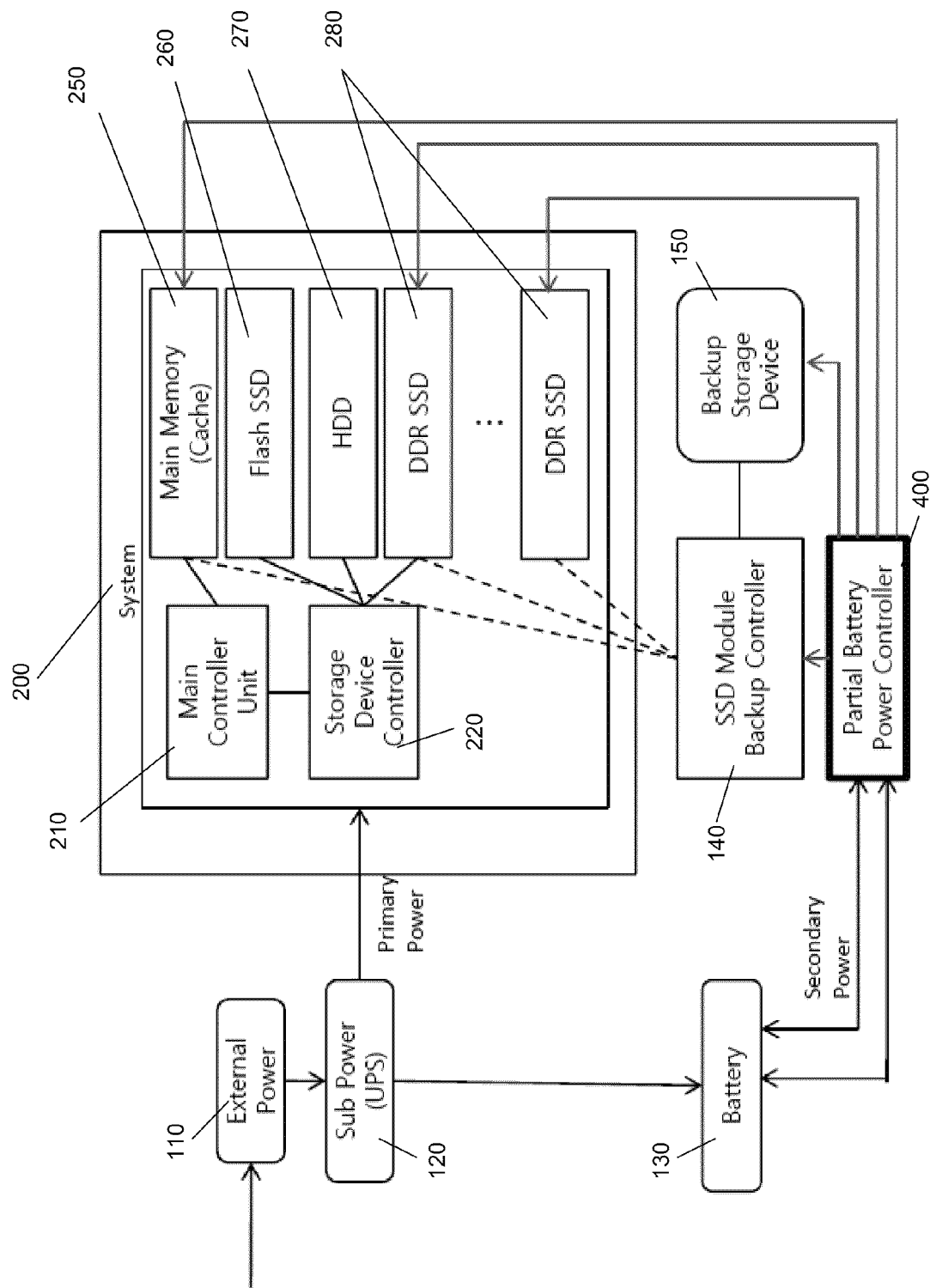
FIG. 2 shows a schematic of a battery backup device according to an embodiment of the subject invention.

FIG. 2 shows a schematic of a battery backup device according to an embodiment of the subject invention. Referring to FIG. 2, a partial battery power controller 400 can be in operable communication (e.g., physically connected, electrically connected, and/or directly electrically connected) with one or more batteries 130. The one or more batteries 130 can be included in or in operable communication (e.g., physically connected, electrically connected, and/or directly electrically connected) with, for example, a sub power device 120 such as a UPS, though embodiments are not limited thereto. The one or more batteries 130 can be considered as part of the battery backup device, external to the battery backup device, or a combination thereof. The battery backup device can provide backup power to one or more systems (e.g., system 200), devices (e.g., devices 250, 260, 270, and/or 280), and/or components. For example, the battery backup device can provide backup power to a system 200 having memory devices 250. The system 200 may also include a main controller unit 210 and/or a storage device controller 220. The main controller unit 210 can be in operable communication with a main memory device 250 (if present) and/or the storage device controller 220 (if present), and the storage device controller 220 (if present) can be in operable communication with a flash SSD 260 (if present), a hard disk drive (HDD) 270 (if present), one or more memory devices 280 (if present), and/or the main controller unit 210 (if present). For example, each of these components can be in operable communication by being physically connected, electrically connected, directly electrically connected, and/or in wireless communication. In an embodiment, if external power 110 is interrupted but sub power remains, the main controller unit 210 can control backup of a main memory device 250 to one or more backup storage devices 150, and the storage device controller 220 can control backup of a flash SSD 260, an HDD 270, and/or one or more volatile memory devices 280 to one or more backup storage devices 150. Each backup storage device 150 can be, for example, a computer readable medium, though embodiments are not limited thereto.

In an embodiment, memory devices 280 can include, but are not limited to, volatile and non-volatile random access memories (RAM; DRAM; SDRAM—including but not limited to SDR, DDR, DDR1, DDR2, DDR3 and the like; SRAM; NVRAM; NVSRAM), magnetic and ferromagnetic/ferroelectric memories (MRAM, FeRAM), phase-change random access memory (PRAM), flash memory and other volatile and non-volatile media now know or later developed that is capable of storing computer-readable information/data. For example, each memory device 280 can be a volatile memory device, such as a DDR SSD. Computer-readable media should not be construed or interpreted to include any propagating signals.

In an embodiment, the partial battery power controller 400 can manage a backup operation to one or more systems, devices, and/or components. For example, the partial battery power controller 400 can manage a backup operation to one or more main memory devices 250 and/or one or more DDR SSDs 280. In a particular embodiment, the battery backup device can include an SSD module backup controller 140 and/or one or more backup storage device 150. The partial battery power controller 400 can be in operable communication with the SSD module backup controller 140 (if present) and/or the one or more backup storage devices 150 (if present), and the SSD module backup controller 140 (if present) can be in operable communication with the one or more backup storage devices 150. For example, each of these components can be in operable communication by being physically connected, electrically connected, directly electrically connected, and/or in wireless communication. The data from the systems, devices, and/or components to be backed up can be backed up to one or more backup storage devices 150, and the systems, devices, and/or components to be backed up can be in operable communication with the one or more backup storage devices 150.

In an embodiment, a battery backup device can perform a backup operation for one or more systems (e.g., system 200), devices (e.g., devices 250, 260, 270, and/or 280), and/or components in the event that primary power (e.g., external power 110 and/or sub power 120) is lost. The partial battery power controller 400 can cut off power to each system, device, and/or component system individually, such that, during a backup operation, after a certain system, device, or component is backed up, the partial battery power controller 400 can shut power off to that device or system, thereby efficiently managing battery power. That is, once data backup has been completed for a particular system, device, or component, the partial battery power controller can shut off power from the one or more batteries to that system, device, or component. The order in which power is shut off to the systems, devices, and/or components can depend on the order in which the systems, devices, and/or components complete data backup and, thus, may not necessarily be the same each time. That is, the device whose data backup is completed first can have power shut off to it first, and so on. For example, during a backup operation, the partial battery power controller 400 can provide power from the one or more batteries 130 to the main memory device 250 and one or more DDR SSDs 280. Once data backup of the main memory device 250 is complete, the partial battery power controller 400 can shut off power from the one or more batteries 130 to the main memory device 250. Once data backup of a DDR SSD 280 is complete, the partial battery power controller 400 can shut off power from the one or more batteries 130 to that DDR SSD 280, though the order in which power is shut off to the main memory device 250 and each of the DDR SSDs 280 is not necessarily as listed here and can depend on the order in which data backup is complete on the main memory device 250 and the DDR SSDs 280. That is, the device whose data backup is completed first can have power shut off to it first, and so on. The data of each device can be backed up to, for example, one or more backup storage devices (e.g., device(s) 150). Once each system, device, and/or component has been backed up, the power supplied from the one or more batteries 130 can be zero or essentially zero. Thus, the one or more batteries 130 can be of lower capacity than those used in existing battery backup devices, thereby decreasing power consumption and charging time.

In an embodiment, during a backup operation, the partial battery power controller 400 can be provided instead of, or in addition to, an SSD module backup controller 140. Data from volatile memory devices (e.g., 250 and 280) can be backed up to one or more backup storage devices (e.g., device(s) 150). A system 200 being backed up can also include a storage device controller 220.

In an embodiment, in a normal condition the SSD module backup controller can monitor the status of power provided to one or more systems, devices, and/or components. When an error occurs (e.g., power is interrupted), the SSD module backup controller can transition to a "backup proceed" condition and notify the partial battery power controller. The partial battery power controller can manage power individually of systems, devices, and/or components to be backed up. That is, the partial battery power controller can shut off power from the one or more batteries to the systems, devices, and/or components one by one, with power being shut off to a system, device, or component once data backup of that particular system, device, or component has been completed. In an embodiment, the SSD module backup controller can send a backup completion signal to the partial battery power controller once data backup of a particular system, device, or component is complete.

In an embodiment, a backup operation can be performed on one or more systems, devices, and/or components if primary power (e.g., external 110 and/or sub 120 power) is interrupted. A battery backup device can provide power from one or more batteries and provide power to one or more systems, devices, and/or components. The battery backup device can provide power from a single battery, from one battery at a time from a plurality of batteries, from multiple batteries of a plurality of batteries (e.g., some batteries at a time from the plurality of batteries or all batteries at once from the plurality of batteries), or can choose depending on the situation. The one or more batteries can be part of the battery backup device, external to the battery backup device, or a combination thereof. The battery backup system cut off power to each system, device, and/or component individually, such that, during a backup operation, after all data of a certain system, device, and/or component is backed up, the battery backup device can shut power off to that system, device, and/or component, thereby efficiently managing battery power. That is, once data backup has been completed for a particular system, device, or component, the partial battery power controller can shut off power to that system, device, or component. The data can be backed up to one or more backup storage devices. That system or device can be backed up from the one or more batteries and then power can be shut off to that system or device once the system or device is backed up. In many embodiments, this process can be accomplished through the use of a partial battery power controller.

In an embodiment, the battery backup device can provide power to one system, device, or component to be backed up at a time during a backup operation. Once data backup has been completed for that particular system, device, or component, the backup battery device can shut off power to that system, device, or component and provide power to another system, device, or component. This can continue until all systems, devices, and/or components connected to the battery backup device have completed data backup. In many embodiments, this process can be accomplished through the use of a partial battery power controller.

In an embodiment, the partial battery power controller can provide power from only one battery of a plurality of batteries at a time. Once power from that particular battery has been exhausted, the partial battery power controller can provide power from another battery of the plurality of batteries until that battery is exhausted, and so on.

In an embodiment, a method of fabricating a battery backup device can include fabricating a partial battery power controller and providing the partial battery power controller in operable communication with at least one battery. The partial battery power controller can be configured to supply power from the at least one battery to a plurality of components of a system to be backed up. The partial battery power controller can also be configured such that, during a backup operation, once data backup of a particular component of the plurality of components is complete, the partial battery power controller shuts off power from the at least one battery to that particular component.

In an embodiment, the partial battery power controller can be configured to shut off power to one or more systems, devices, and/or components individually, such that, during a backup operation, after all data of a certain system, device, or component is backed up, the battery backup device can shut power off from the one or more batteries to that device or system. That is, once data backup has been completed for a particular system, device, or component, the partial battery power controller can shut off power to that system, device, or component. Once each system, device, and/or component has been backed up, the power supplied from the one or more batteries can be zero or essentially zero. Thus, the one or more batteries can be of lower capacity than those used in existing battery backup devices, thereby decreasing power consumption and charging time.

In an embodiment, the partial battery power controller can be configured provide power to one system or device to be backed up, and with which the partial battery power controller in operable communication, at a time during a backup operation. Once data backup has been completed for that particular system, device, or component, the partial battery power controller can shut off power to that system, device, or component and provide power to another system, device, or component. This can continue until all systems, devices, and/or components connected to the battery backup device have completed data backup.

In an embodiment, the partial battery power controller can be configured to provide power from only one battery of a plurality of batteries at a time. Once power from that particular battery has been exhausted, the partial battery power controller can provide power from another battery of the plurality of batteries until that battery is exhausted, and so on.

In an embodiment, the method of fabricating a battery backup device can further include fabricating an SSD module backup controller and/or one or more backup storage devices. The partial battery power controller can be in operable communication with the SSD module backup controller and/or the backup storage device(s). Data from one or more systems, devices, and/or components can be backed up to the one or more backup storage devices. The partial battery power controller can be configured such that each system and/or device can be backed up from the one or more batteries and then power from the one or more batteries can be shut off to that system or device once the system or device is backed up. Each backup storage device can be, for example, a computer readable medium, though embodiments are not limited thereto.

In an embodiment, the method of fabricating a battery backup device can further include fabricating or obtaining a sub power device (e.g., a UPS). The partial battery power controller can be in operable communication with the sub power device and/or the one or more batteries can be in operable communication with the sub power device, though embodiments are not limited thereto. In the event that external power is lost or interrupted, the sub power device can provide primary power to one or more systems, devices, and/or components. In the event that all primary power is lost or interrupted, the one or more batteries can provide secondary power to the one or more systems, devices, and/or components, thereby allowing backup of data.

According to embodiments of the subject invention, a battery backup device can include a partial battery power controller to efficiently manage power from one or more batteries when a backup operation is performed. The partial battery power controller can shut off power individually to one or more systems, devices, and/or components to be backed up. During a backup operation, the partial battery power controller efficiently manages battery power by shutting off power from one or more batteries to a system or device once a backup of that system or device is complete. This can increase the efficiency of the system by using lower capacity batteries and decreasing power consumption and charging time.

According to embodiments of the subject invention, power consumption can be decreased by performing a backup operation individually and consecutively on one or more systems, devices, and/or components. That is, power can be supplied to one system, device, or component at a time until that particular system, device, or component has completed data backup. Thus, a battery backup device of the subject invention can utilize batteries of lower capacity than are used in existing battery backup devices, thereby decreasing power consumption and charging time. This also increases the efficiency and reliability of the backup operation due to lower charging time.

Embodiments of the subject invention can provide efficient and advantageous backup power management of high-performance SSD device, including those having volatile memory. Embodiments of the subject invention can also provide efficient and advantageous backup power management of high-performance storage devices based on high-performance SSD devices, backup power management of various cache devices having volatile memory, and/or backup power management of various high-speed access devices using volatile memory.

In certain embodiments, systems, devices, and/or components to be backed up by a battery backup device can include computer-based systems. Computer systems can have hardware including one or more computer processing units (CPUs), memory (e.g., volatile memory), mass storage (e.g., hard drive), and/or I/O devices (e.g., network interface, user input devices). Elements of the computer system hardware can communicate with each other via a bus. The computer system hardware can be configured according to any suitable computer architectures such as a Symmetric Multi-Processing (SMP) architecture or a Non-Uniform Memory Access (NUMA) architecture. The one or more CPUs may include multiprocessors or multi-core processors and may operate according to one or more suitable instruction sets including, but not limited to, a Reduced Instruction Set Computing (RISC) instruction set, a Complex Instruction Set Computing (CISC) instruction set, or a combination thereof. In certain embodiments, one or more digital signal processors (DSPs) may be included as part of the computer hardware of the system in place of or in addition to a general purpose CPU.

Certain techniques set forth herein may be described in the general context of computer-executable instructions, such as program modules, executed by one or more computers or other devices. Certain embodiments of the invention contemplate the use of a computer system or virtual machine within which a set of instructions, when executed, can cause the system to perform any one or more of the methodologies discussed above. Generally, program modules include routines, programs, objects, components, and data structures that perform particular tasks or implement particular abstract data types.

It should be appreciated by those skilled in the art that computer-readable media include removable and non-removable structures/devices that can be used for storage of information, such as computer-readable instructions, data structures, program modules, and other data used by a computing system/environment. A computer-readable medium includes, but is not limited to, volatile memory such as random access memories (RAM, DRAM, SRAM); and non-volatile memory such as flash memory, various read-only-memories (ROM, PROM, EPROM, EEPROM), magnetic and ferromagnetic/ferroelectric memories (MRAM, FeRAM), and magnetic and optical storage devices (hard drives, magnetic tape, CDs, DVDs); or other media now known or later developed that is capable of storing computer-readable information/data. Computer-readable media should not be construed or interpreted to include any propagating signals.

Of course, the embodiments of the invention can be implemented in a variety of architectural platforms, devices, operating and server systems, and/or applications. Any particular architectural layout or implementation presented herein is provided for purposes of illustration and comprehension only and is not intended to limit aspects of the invention.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. In addition, any elements or limitations of any invention or embodiment thereof disclosed herein can be combined with any and/or all other elements or limitations (individually or in any combination) or any other invention or embodiment thereof disclosed herein, and all such combinations are contemplated with the scope of the invention without limitation thereto.

It should be understood that the examples and embodiments described herein are for illustrative purposes only and that various modifications or changes in light thereof will be suggested to persons skilled in the art and are to be included within the spirit and purview of this application.

What is claimed is:

1. A battery backup device, comprising:
   at least one battery; and
   a partial battery power controller configured to supply power from the at least one battery to a plurality of components of a system to be backed up;
   wherein the partial battery power controller is directly connected with the plurality of components of a system to be backed up; and
   wherein the partial battery power controller is configured such that, during a backup operation, once data backup of a particular component of the plurality of components is complete, the partial battery power controller shuts off power from the at least one battery to that particular component.

2. The battery backup device according to claim 1, further comprising a semiconductor storage device (SSD) module backup controller in operable communication with the partial battery power controller.

3. The battery backup device according to claim 2, wherein the SSD module backup controller is configured to send a backup completion signal to the partial battery power controller once data backup of the particular component is complete.

4. The battery backup device according to claim 3, further comprising at least one backup storage device in operable communication with the SSD module backup controller, and wherein the at least one backup storage device is configured to store data from the plurality of components of the system to be backed up.

5. The battery backup device according to claim 2, wherein the SSD module backup controller is configured to send a signal to notify the partial battery power controller when primary power to the system to be backed up has been interrupted.

6. The battery backup device according to claim 1, further comprising at least one backup storage device in operable communication with the system to be backed up, and
   wherein the at least one backup storage device is configured to store data from the plurality of components of the system to be backed up.

7. The battery backup device according to claim 1, wherein the plurality of components comprises at least one volatile memory device.

8. The battery backup device according to claim 1, wherein the partial battery power controller is configured to supply power from the at least one battery to only one component of the plurality of components at a time.

9. The battery backup device according to claim 1, further comprising:
   a SSD module backup controller in operable communication with the partial battery power controller; and
   at least one backup storage device in operable communication with the SSD module backup controller and the system to be backed up,
   wherein the at least one backup storage device is configured to store data from the plurality of components of the system to be backed up,
   wherein the SSD module backup controller is configured to send a signal to notify the partial battery power controller when primary power to the system to be backed up has been interrupted,
   wherein the SSD module backup controller is configured to send a backup completion signal to the partial battery power controller once data backup of the particular component is complete, and
   wherein the plurality of components comprises at least one volatile memory device.

10. A method of performing a backup operation on a system, comprising:
    providing a battery backup device in operable communication with the system,
    wherein the battery backup device comprises:
    at least one battery; and
    a partial battery power controller configured to supply power from the at least one battery to a plurality of components of the system if primary power to the system is interrupted;
    wherein the partial battery power controller is directly connected with the plurality of components of a system to be backed up; and
    wherein the partial battery power controller is configured such that, during the backup operation, once data backup of a particular component of the plurality of components is complete, the partial battery power controller shuts off power from the at least one battery to that particular component.

11. The method according to claim 10, wherein the battery backup device further comprises a SSD module backup controller in operable communication with the partial battery power controller.

12. The method according to claim 11, wherein the battery backup device further comprises at least one backup storage device in operable communication with the SSD module backup controller, and
    wherein the at least one backup storage device is configured to store data from the plurality of components of the system.

13. The method according to claim 11, wherein the SSD module backup controller is configured to send a signal to notify the partial battery power controller when primary power to the system has been interrupted.

14. The method according to claim 10, wherein the plurality of components comprises at least one volatile memory device.

15. The method according to claim 10, wherein the partial battery power controller is configured to supply power from the at least one battery to only one component of the plurality of components at a time.

16. The method according to claim 10, wherein the battery backup device further comprises at least one backup storage device in operable communication with the system, and
    wherein the at least one backup storage device is configured to store data from the plurality of components of the system.

17. The method according to claim 10, wherein the battery backup device further comprises:
    a SSD module backup controller in operable communication with the partial battery power controller; and
    at least one backup storage device in operable communication with the SSD module backup controller and the system,
    wherein the at least one backup storage device is configured to store data from the plurality of components of the system,
    wherein the SSD module backup controller is configured to send a signal to notify the partial battery power controller when primary power to the system has been interrupted,
    wherein the SSD module backup controller is configured to send a backup completion signal to the partial battery power controller once data backup of the particular component is complete, and
    wherein the plurality of components comprises at least one volatile memory device.

\* \* \* \* \*